United States Patent [19]

Lehrer

[11] Patent Number: 4,619,839

[45] Date of Patent: Oct. 28, 1986

[54] METHOD OF FORMING A DIELECTRIC LAYER ON A SEMICONDUCTOR DEVICE

[75] Inventor: William I. Lehrer, Los Altos, Calif.

[73] Assignee: Fairchild Camera & Instrument Corp., Mountain View, Calif.

[21] Appl. No.: 680,878

[22] Filed: Dec. 12, 1984

[51] Int. Cl.[4] .......................................... H01L 21/316
[52] U.S. Cl. ....................................... 427/82; 427/89; 427/93; 427/240
[58] Field of Search ...................... 427/82, 93, 240, 89

[56] References Cited

U.S. PATENT DOCUMENTS

| 4,243,427 | 1/1981 | DiBugnara | 427/93 |
| 4,277,525 | 7/1981 | Nakayama | 427/387 |
| 4,385,086 | 5/1983 | Nakayama | 427/82 |

OTHER PUBLICATIONS

Rothon and Ashley, "Ultraviolet Absorbing Low Permeability, Iron III Phosphate Coatings", Chemistry and Industry, Nov. 1975, pp. 976-978.

Rothon, "Solution-Deposited Metal Phosphate Coatings", Thin Solid Films, vol. 77, 1981, pp. 149-153.

Primary Examiner—John D. Smith
Attorney, Agent, or Firm—Carl L. Silverman; David H. Carroll; William H. Murray

[57] ABSTRACT

A method for forming a substantially planar inorganic dielectric layer over a predetermined pattern of electrical interconnects comprises the steps of reacting phosphoric acid and a trivalent metallic halide compound with an aliphatic solvent to form a coating fluid. The coating fluid is then spun onto the semiconductor device to form a layer over the electrical interconnect. The resultant device is then baked at a first temperature to drive off the solvent and then baked at a second, higher temperature, in order to promote the glass forming reaction. This process is repeated as required to form a coating layer having a thickness which exhibits levelling characteristics of such high quality that fine topography can be carried out on succeeding layers of metal in order to form additional interconnect layers with precision.

18 Claims, 2 Drawing Figures

4,619,839

METHOD OF FORMING A DIELECTRIC LAYER ON A SEMICONDUCTOR DEVICE

BACKGROUND OF THE INVENTION

This invention relates to methods for processing semiconductor devices and more particularly to a method for forming a substantially planar inorganic dielectric layer for use in multilevel semiconductor devices.

In constructing multi-level semiconductor devices, it is necessary to provide an insulating layer between each layer of electrically conducting interconnects. Each dielectric layer must be substantially planar and continuous, that is without cracks or voids, in order to enhance the formation of subsequent interconnect layers and to provide high dielectric integrity between such conductive layers. In addition to promoting continuity in the overlying second metal layer, a planarized dielectric enables the formation of very fine photolithographic patterns to define interconnect layouts with extreme precision. Modern exposure equipment typically comprise projection type printers with a very narrow focusing depth of field. Consequently, any deviation from planarity throws the pattern out of focus and results in poor definition.

In the prior art, insulating layers made from organosilicates, were spun onto the semiconductor device then heated to remove the solvent and form a silicon dioxide type glass. The problem with such prior art technology is that the silicon dioxide layers formed by organosilicate decomposition typically have low dielectric integrity. Furthermore, the maximum thickness to which such materials can be formed by a spin-on process, which process enhances the planarization of the surface of such layers, is approximately 6,000Å and on difficult geometries, substantially less. Spinning on layers having greater thicknesses would result in cracks and crazing, thereby decreasing the integrity of the dielectric layer.

For example, prior art silicon dioxide films formed from solutions of silicon alkoxides, such as tetraethylorthosilane (TEOS), have fairly good dielectric integrity when they are continuous. Such continuity reliably occurs only when these films are applied over substantially flat, unpatterned substrates. When applied over patterned wafers, such films are prone to severe cracking; therefore, film thicknesses in excess of 2,000 to 3000Å are not satisfactory. The problem worsens when the patterned wafer includes areas of widely differing thermal expansion, such as aluminum metallization atop a silicon wafer. In such cases, films of 2,000 to 3,000Å have proven quite unreliable, especially when subjected to temperature excursions typically encountered in subsequent processing.

SUMMARY OF THE INVENTION

The present invention is a method of forming a substantially planar dielectric layer on a semiconductor device. The method comprises the steps of reacting phosphoric acid and a metallic compound with an aliphatic solvent to form a coating fluid. The coating fluid is then spun onto a surface of the semiconductor device, typically over the interconnect to form a dielectric layer of a predetermined thickness. The topography layer is then heated to at least a first predetermined temperature for at least a first predetermined period of time in order to drive off the solvent and promote the formation of a phosphate based glass. This phosphate based glass layer can be spun onto the interconnect topography to thicknesses in the order of one to two microns without cracking and crazing, thereby forming a dielectric layer of high integrity, having an upper surface with superior levelling characteristics.

Consequently, it is an object of the present invention to provide a method for forming a dielectric layer, of high dielectric integrity, having a substantially planar upper surface.

It is a further object of the present invention to form such a dielectric layer over a topography of interconnects while maintaining a substantially planar surface of the dielectric thereby enabling the formation of continuous metallic layers thereover.

It is yet another object of the present invention to form such a dielectric layer over a topography of interconnects while maintaining a substantially planar surface of the dielectric thereby enabling the formation of very fine photolithographic patterns required to define overlying electrical interconnects with precision.

Other objects, features and advantages of the present invention will become more fully apparent from the following detailed description of the preferred embodiment, the appended claims and the accompanying drawing.

DETAILED DESCRIPTION OF THE PREFERRED EMBODIMENT

Figure 1:
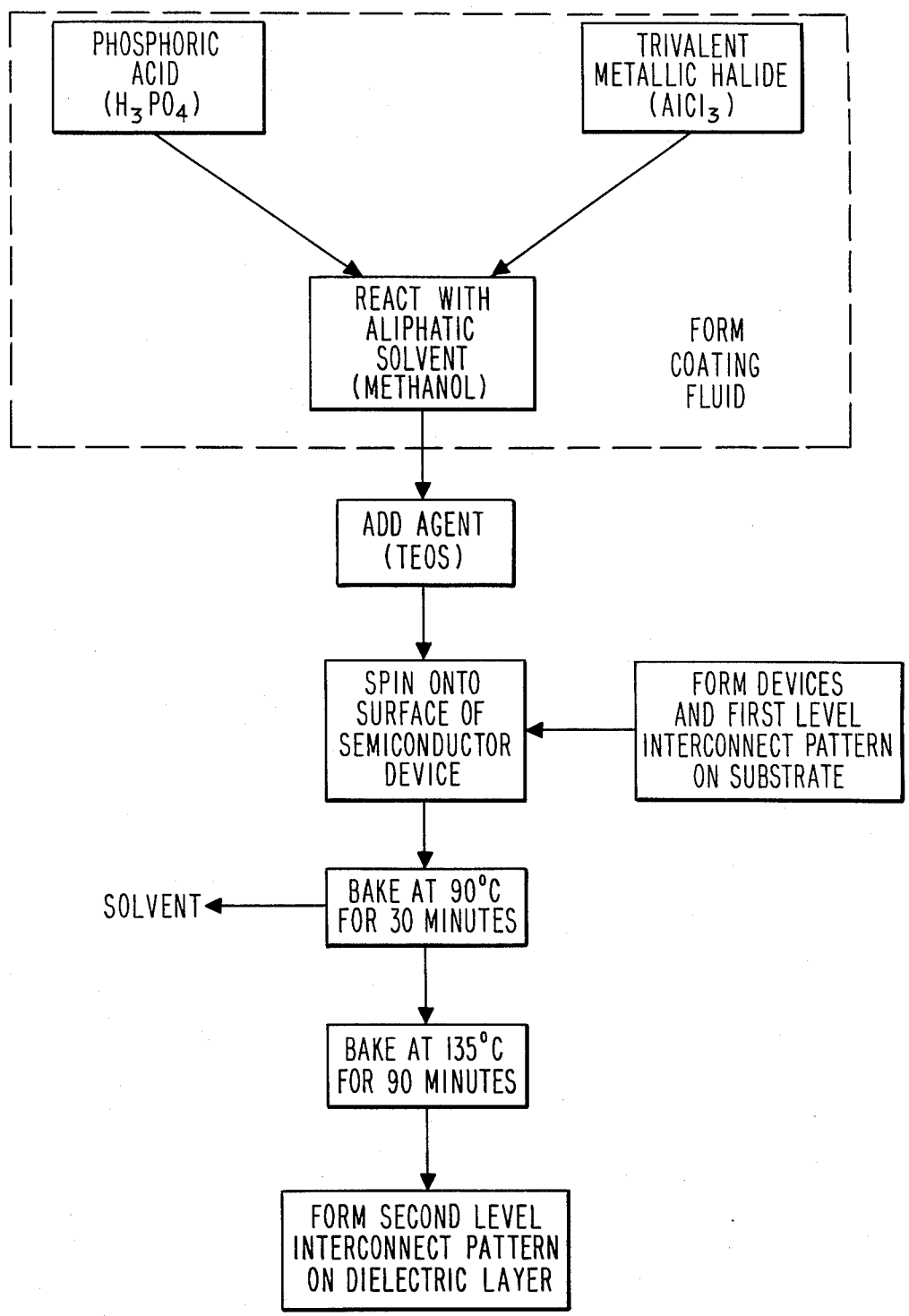
FIG. 1 is a flow diagram depicting the steps of a preferred embodiment of the method of the present invention.

Although specific forms of the invention have been selected for illustration in the drawing, and the following description is drawn in specific terms for the purpose of describing these forms of the invention, this description is not intended to limit the scope of the invention which is defined in the appended claims.

It has been found that, in accordance with the method of the present invention, reacting a trivalent material with a phosphate in an organic matrix, spinning this formulation onto the metallic interconnect topography of a semiconductor substrate then heating to drive off the organic matrix and form a glass yields a dielectric layer of high integrity with excellent levelling characteristics.

Referring to FIG. 1, there is shown a flow diagram depicting the steps of the preferred embodiment of the method of the present invention. As shown in FIG. 1, phosphoric acid ($H_3PO_4$) and a trivalent metallic halide such as aluminum chloride ($AlCl_3$), ferric chloride ($FeCl_3$) or chromic chloride ($CrCl_3$), preferably aluminum chloride ($AlCl_3$), are reacted in molar proportion with an aliphatic solvent, preferably a lower alcohol such as methanol, to form a coating fluid. The use of lower alcohols is preferred because of the ease of breakup of the metal phosphate-organic complex at lower temperatures as well as their removal. In addition, materials such as cyclopentanone can be added to the solution to aid in promoting even spinning and may also be used as a matrix for the formed complex which can be separated and dissolved in it. However, for the initial complex formation, the lower boiling solvents are to be preferred.

If desired, a small amount (preferably less than ten molar percent) of a agent, such as TEOS or boric oxide ($B_2O_3$), which are consistant with the solvent system, may be added to the coating fluid to further ensure the resultant dielectric layer is free from cracks and crazing. TEOS and boric oxide function as anti-cracking agents which act to alter the thermal expansion coefficient of the spun-on film to accommodate difficult geometries and retard cracking of the film.

In the preferred process, the semiconductor devices are formed in a substrate and are then interconnected in a desired pattern, using known processes such as photolithographic techniques. After the metallic interconnect pattern connecting the semiconductor device is formed, the coating layer is spun over the interconnect topography. The preferred spin-on process comprises placing the wafer on a spin-chuck, for example, EC101D Photoresist Spinner (Headway Research Inc., Garland, Tx.). Utilizing a filtered bottle applicator, sufficient solution is placed on the surface to cover the wafer. The wafer is then spun at the RPM's necessary to secure the thickness wanted.

Figure 2:
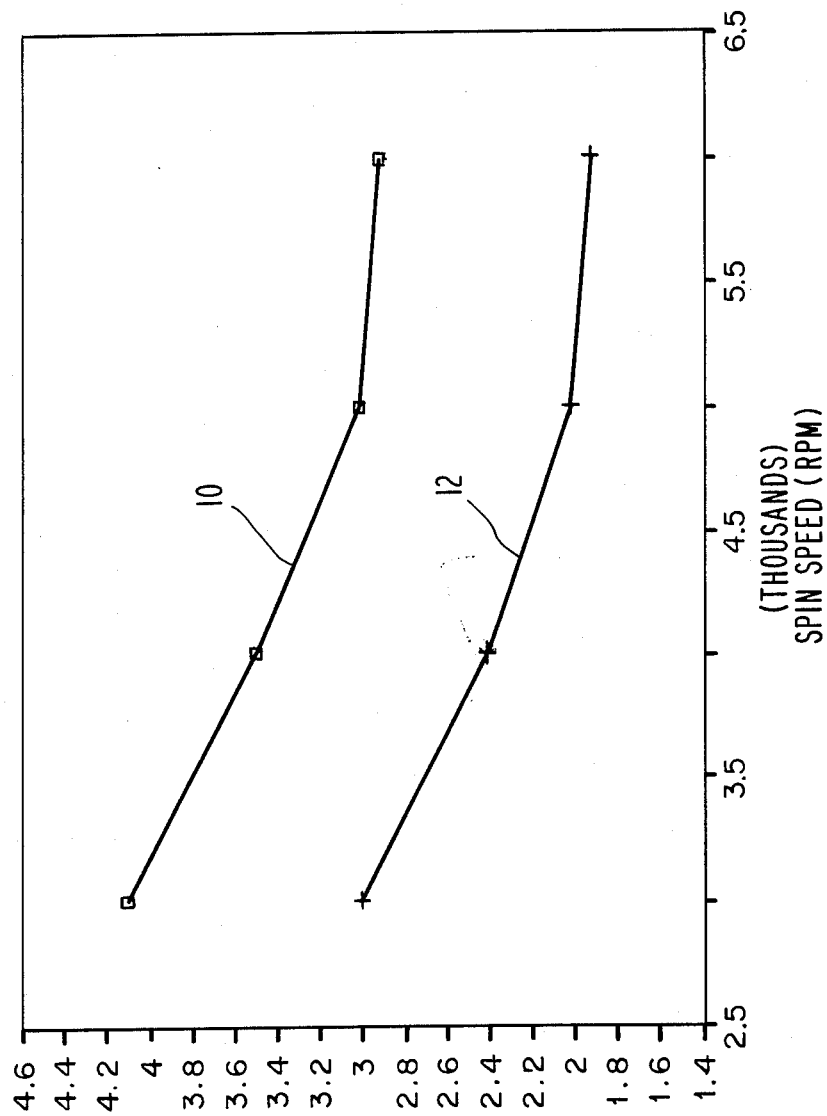
FIG. 2 is a graph depicting film thickness versus spin speed for spinning on a dielectric layer in accordance with a preferred embodiment of the present invention, and further depicting a first plot for a first formulation of coating fluid and a second plot for a second formulation of coating fluid.

FIG. 2 is a graph depicting plots of film thickness versus spin speed for a single coating of 1:1 (see reference numeral 10) and 1:2 (see reference numeral 12) proportions of methanol to the molar proportion of phosphoric acid and aluminum chloride. As shown in plot 10 of FIG. 2, with the basic formulation diluted with methanol in a 1:1 proportion, layer thicknesses from approximately 3,000Å to approximately 4,100Å can be formed by spinning on the formulation at speeds of from 6,000 to 3,000 RPM respectively. Similarly, utilizing a basic formulation diluted with a 1:2 proportion of methanol yields layers having thicknesses of approximately 2,000Å to approximately 3,000Å utilizing spin speeds of approximately 6,000 to 3,000 RPM respectively, as shown in plot 12. Consequently to achieve, for example, a thickness of 3,000Å using a coating consisting of a 1:2 proportion, the wafer is spun at 3,000 RPM, preferably for thirty seconds.

After obtaining a layer having the desired thickness, the wafer is removed from the spin-on equipment and heated for a predetermined period of time. As shown in FIG. 1, it is preferred that the heating step comprise a two stage heating cycle, the first being 90° C. for thirty minutes in order to drive off the solvent and the second being 135° C. for ninety minutes in order to promote the glass forming reaction. It should be noted that if further densification is required, then a higher temperature bake, for example, 500° C. for thirty minutes, can be performed. The limit on such subsequent bake is determined by the metallurgy involved in the construction of the wafer. For example, if aluminum is used as the interconnect structure, then the bake temperature is limited by the aluminum-silicon eutectic temperatures to a value less than approximately 500° C.

It is preferred that the coating thickness be substantially be in the range of from approximately one to two microns. Such a thickness exhibits levelling characteristics of such high quality that fine lithography can be carried out on succeeding layers of metal in order to form additional interconnect layers with precision. Since thicknesses on the order of from about one to two microns are preferred, the wafer is successively coated in accordance with the spin-on process described above until such thicknesses are achieved. For example if a coating thickness of 1.2 microns is desired, four coatings of approximately 3,000Å each would be formed in accordance with the example set forth above.

Subsequent layers of electrical interconnects can be formed by first establishing a predetermined pattern of apertures, sometimes referred to as vias, through the coating over the interconnect topography, in order to expose those portions of the underlying interconnect topography to which electrical contact is desired. Electrical contact can be made with these portions of the interconnect topography by, for example, depositing metal into the vias thereby establishing a vertical pattern of electrical interconnects. It is preferred that the upper surface of these vertical interconnects be substantially planar with respect to the planarized upper surface of the coating. A metal layer is then formed over then planarized coating and the vertical interconnects by known deposition techniques. A second predetermined pattern of electrical interconnects is then formed in this metal layer using, for example, known photolithographic techniques. This creates a second interconnect topography over which a second coating can be formed using the process of the present invention as described above. Subsequent layers of electrical interconnects having a planarized coating thereover, can be similarly formed.

It will be understood that various changes in the details, materials and arrangements of the parts which have been herein described and illustrated in order to explain the nature of this invention, may be made by those skilled in the art within the principle and scope of the invention as expressed in the following claims.

I claim:

1. A method of forming a substantially planar layer of an electrically insulating material over electrical interconnect topography on a semiconductor device, said method comprising the steps of:
   (a) reacting phosphoric acid and a trivalent metallic halide compound with an aliphatic solvent to form a coating fluid;
   (b) spinning said coating fluid onto a surface of said semiconductor device to form a layer over said interconnect topography; and
   (c) heating at least said layer to at least a first predetermined temperature for at least a first predetermined period of time.

2. The method in accordance with claim 1 wherein said trivalent metallic halide compound is selected from the group consisting essentially of aluminum chloride, ferric chloride and chromic chloride.

3. The method in accordance with claim 2 wherein said aliphatic solvent is selected from the group consisting essentially of methanol, ethanol, propanol and butanol.

4. The method in accordance with claim 3 wherein said trivalent metallic halide compound comprises aluminum chloride.

5. The method in accordance with claim 4 wherein said aluminum chloride and said phosphoric acid are mixed in molar proportion.

6. The method in accordance with claim 5 wherein said aliphatic solvent comprises methanol.

7. The method in accordance with claim 6 wherein said methanol and said molar proportion of aluminum chloride and phosphoric acid are combined in 1:1 proportion.

8. The method in accordance with claim 6 wherein said methanol and said molar proportion of aluminum chloride and phosphoric acid are combined in 1:2 proportion.

9. The method in accordance with claim 3 additionally comprising the step of adding a predetermined amount of cyclopentanone.

10. The method in accordance with claim 3 additionally comprising the step of adding a predetermined amount of an agent, selected from the group consisting essentially of TEOS and boric oxide, to said coating fluid.

11. The method in accordance with claim 10 wherein said predetermined amount of said agent is less than ten molar percent.

12. The method in accordance with claim 3 wherein step (c) comprises the steps of:
 (1) heating said layer at a first temperature for a first period of time; then
 (2) heating said layer at a second temperature for a second period of time.

13. The method in accordance with claim 12 wherein step (c) comprises the steps of:
 (1) heating said layer at a temperature substantially equal to 90° C. for approximately 30 minutes; then
 (2) heating said layer at a temperature substantially equal to 135° C. for approximately 90 minutes.

14. The method in accordance with claim 12 additionally comprising the step of:
 (d) repeating steps (b) and (c) as required to form a first layer having a predetermined thickness.

15. The method in accordance with claim 14 wherein the predetermined thickness of said first layer is in a range of from substantially one micron to two microns inclusive.

16. The method in accordance with claim 14 additionally comprising the steps of:
 (e) forming a first set of vias through said first layer for making electrical contact with said under lying interconnect topography at predetermined locations thereon;
 (f) forming a second predetermined pattern of electrical interconnects on said first layer, said pattern of electrical interconnects making electrical contact with said interconnect topography through said vias;
 (g) spinning said coating fluid over said predetermined interconnect pattern to form a layer thereover;
 (h) heating at least said layer to at least a first predetermined temperature for at least a first predetermined period of time; and
 (i) repeating steps (g) and (h) as required to form a second layer having a predetermined thickness.

17. The method in accordance with claim 16 wherein the predetermined thickness of said second layer is substantially equal to the predetermined thickness of said first layer.

18. The method in accordance with claim 17 wherein steps (e) through (i) are repeated at least once to form at least a third electrical interconnect pattern having a substantially planarized coating of predetermined thickness formed thereover.

* * * * *